US010396806B1

(12) United States Patent
Chang et al.

(10) Patent No.: US 10,396,806 B1
(45) Date of Patent: Aug. 27, 2019

(54) VOLTAGE REGULATOR BASED LOOP FILTER FOR LOOP CIRCUIT AND LOOP FILTERING METHOD

(71) Applicant: M31 TECHNOLOGY CORPORATION, Hsinchu County (TW)

(72) Inventors: Ching-Hsiang Chang, Taipei (TW); Ming-Ting Wu, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/104,071

(22) Filed: Aug. 16, 2018

(30) Foreign Application Priority Data

Jun. 5, 2018 (TW) .............................. 107119377 A

(51) Int. Cl.
*H03L 7/099* (2006.01)
*H03L 7/089* (2006.01)
*H03L 7/18* (2006.01)

(52) U.S. Cl.
CPC ............ *H03L 7/099* (2013.01); *H03L 7/0893* (2013.01); *H03L 7/18* (2013.01); *H03L 2207/06* (2013.01)

(58) Field of Classification Search
CPC . H03L 7/093; H03L 7/099; H03L 5/00; H03L 7/18; H03L 7/087; H03L 7/10; H03L 3/00; H03L 1/02
USPC ......................................... 327/156, 158, 161
See application file for complete search history.

(56) References Cited

U.S. PATENT DOCUMENTS

| 5,382,922 A * | 1/1995 | Gersbach ................. H03L 1/00 331/1 A |
| 5,594,388 A * | 1/1997 | O'Shaughnessy ....... H03K 3/03 331/1 R |
| 7,990,225 B1 | 8/2011 | Guo et al. |
| 8,031,027 B2 | 10/2011 | Park et al. |
| 2008/0074200 A1 | 3/2008 | Cong |
| 2010/0277245 A1 | 11/2010 | Liu |
| 2014/0312944 A1 | 10/2014 | Bunch et al. |
| 2018/0017982 A1 | 1/2018 | Song et al. |
| 2018/0212611 A1 | 7/2018 | Shen et al. |

OTHER PUBLICATIONS

Office Action and Search Report dated May 20, 2019 issued by Taiwan Intellectual Property Office for counterpart application No. 108110262.

* cited by examiner

*Primary Examiner* — John W Poos
(74) *Attorney, Agent, or Firm* — WPAT, P.C., Intellectual Property Attorneys; Anthony King

(57) ABSTRACT

A filter circuit includes an amplifier circuit, a resistor-capacitor (RC) network and a first voltage follower. The amplifier circuit has a first input terminal, a second input terminal and an output terminal. The amplifier circuit is configured to output a first output signal from the output terminal according to a first voltage signal at the first input terminal and a second voltage signal at the second input terminal. The RC network, coupled to the first input terminal, is configured to produce the first voltage signal at least in response to a first current signal applied to the first input terminal. The first voltage follower, coupled to the output terminal, is configured to receive the first output signal, and generate a first filtered signal in response to the first output signal.

19 Claims, 8 Drawing Sheets

VOLTAGE REGULATOR BASED LOOP FILTER FOR LOOP CIRCUIT AND LOOP FILTERING METHOD

BACKGROUND

The present disclosure relates to a filter circuit and, more particularly, to a loop filter used in a phase-locked loop (PLL) circuit and a loop filtering method for a PLL circuit.

A PLL circuit, one of fundamental parts of a communication system, is a feedback system that maintains a constant phase difference between an output signal and a reference signal. For example, transceivers in wireless communication systems utilize PLL circuits for frequency synthesis, and clock and data recovery (CDR). Also, PLL circuits are incorporated into almost all high speed mixed-signal system-on-chips (SoCs) for clock synchronization, frequency demodulation and frequency synthesis. An SoC is an integrated circuit which integrates numerous components into a single chip to contain various functions such as digital, analog, mixed-signal and radio-frequency (RF) functions.

SUMMARY

The described embodiments provide a voltage regulator based filter circuit, which includes a voltage regulator incorporated with an RC network, a PLL circuit and a loop filtering method for a PLL circuit.

Some embodiments described herein may include a filter circuit. The filter circuit includes an amplifier circuit, a resistor-capacitor (RC) network and a first voltage follower. The amplifier circuit has a first input terminal, a second input terminal and an output terminal. The amplifier circuit is configured to output a first output signal from the output terminal according to a first voltage signal at the first input terminal and a second voltage signal at the second input terminal. The RC network, coupled to the first input terminal, is configured to produce the first voltage signal at least in response to a first current signal applied to the first input terminal. The first voltage follower, coupled to the output terminal, is configured to receive the first output signal, and generate a first filtered signal in response to the first output signal.

Some embodiments described herein may include a phase-locked loop (PLL) circuit. The PLL circuit includes a loop filter, a voltage-to-current converter and a current-controlled oscillator. The loop filter is configured to generate a first control voltage. The loop filter includes an amplifier circuit, a resistor-capacitor (RC) network and a first voltage follower. The amplifier circuit has a first input terminal, a second input terminal and an output terminal. The amplifier circuit is configured to output a first output signal from the output terminal according to a first voltage signal at the first input terminal and a second voltage signal at the second input terminal. The RC network, coupled to the first input terminal, is configured to produce the first voltage signal at least in response to a first current signal applied to the first input terminal. The first voltage follower, coupled to the output terminal, is configured to receive the first output signal, and generate the first control voltage in response to the first output signal. The voltage-to-current converter, coupled to the first voltage follower, is configured to convert the first control voltage to a first control current. The current-controlled oscillator, coupled to the voltage-to-current converter, is configured to generate an oscillator signal at least according to the first control current.

Some embodiments described herein may include a loop filtering method for a phase-locked loop (PLL) circuit. The loop filtering method includes: producing a first voltage signal by at least coupling a first charge pump current signal into a resistor-capacitor (RC) network, the first charge pump current signal being steered by a first charge pump of the PLL circuit; comparing the first voltage signal and a second voltage signal to generate a first output signal; and buffering the first output signal to produce a first filtered signal.

With the use of a voltage regulator based filtering scheme which integrates a voltage regulator and an RC network, a loop circuit using the voltage regulator based filtering scheme can not only enhance the high power supply rejection ratio (PSRR) but also maintain good loop stability. Also, the voltage regulator based filtering scheme may produce multiple control signals for an oscillator, thus enhancing a tuning range and phase noise performance of the oscillator.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
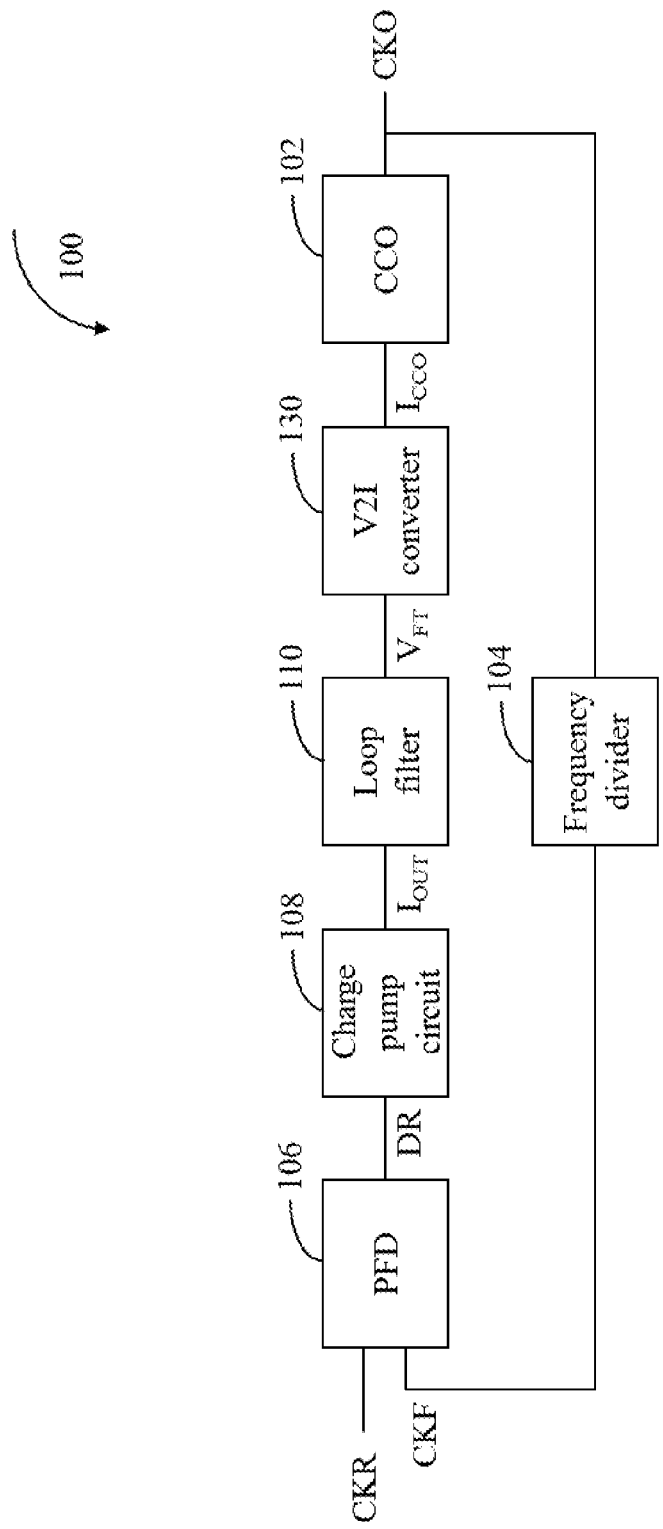
FIG. 1 is a block diagram illustrating an exemplary PLL circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

As analog signals are more susceptible to noise than digital signals, it is difficult to integrate an analog PLL circuit into a digital noisy SoC environment. For example, it is desirable for an SoC-PLL, which is an analog PLL circuit integrated into a SoC, to operate over a wide tuning range while still exhibiting a high power supply rejection ratio (PSRR). One strategy is to add a capacitor in an oscillator control circuit to suppress power supply variations. However, an extra pole is formed accordingly, which may cause stability problems.

The present disclosure describes exemplary filter circuits, incorporating voltage regulators with frequency responsive circuits such as RC networks, to reduce jitter in input signals and smoothen output signals. The exemplary filter circuits can serve as loop filters in loop control systems to realize loop circuits, such as PLL circuits, capable of operating over a wide tuning range while still exhibiting a PSRR. The present disclosure further describes exemplary PLL circuits and loop filtering methods for PLL circuits. Similarly, with the use of voltage regulator based filtering schemes, the exemplary PLL circuits and loop filtering methods can operate over a wide tuning range while still exhibiting a PSRR. Further description is provided below.

FIG. 1 is a block diagram illustrating an exemplary PLL circuit in accordance with some embodiments of the present disclosure. The PLL circuit 100 can be an SoC-PLL, which is a PLL circuit integrated into a SoC, and operate in a digital power domain. For example, the PLL circuit 100 can be configured to provide an oscillator signal CKO for one or more on-chip circuit blocks such as central processing unit(s) (CPU), graphics processing unit(s) (GPU) and digital signal processor(s) (DSP). However, those skilled in the art will recognize that the PLL circuit 100 can operate in an analog power domain without departing from the scope of the present disclosure.

In the present embodiment, the PLL circuit 100 may include a current-controlled oscillator (CCO) 102, a frequency divider 104, a phase frequency detector (PFD) 106, a charge pump circuit 108, a loop filter 110 and a voltage-to-current (V2I) converter 130. The CCO 102 is configured to generate the oscillator signal CKO according to a control current $I_{CCO}$. The frequency divider 104 is configured to perform frequency division on the oscillator signal CKO to generate an input signal CKF, wherein a division factor of the frequency division can be an integer or a fraction.

The PFD 106 is configured to compare a reference signal CKR with the input signal CKF to generate a detection result DR. The detection result DR indicates if the input signal CKF is leading, lagging or in phase with the reference signal CKR, and also indicates a phase difference between the input signal CKF and the reference signal CKR. The charge pump circuit 108 is configured to produce a current output $I_{OUT}$ according to the detection result DR. The current output $I_{OUT}$ may flow from one of the charge pump circuit 108 to the loop filter 110 to the other of the charge pump circuit 108 to the loop filter 110, depending on whether the input signal CKF or the reference signal CKR is leading.

The loop filter 110 is configured to filter the current output $I_{OUT}$ and generate a filtered voltage $V_{FT}$, thereby reducing unwanted spurious noise superimposed on the filtered voltage $V_{FT}$. The V2I converter 130, coupled between the loop filter 110 and the CCO 102, is configured to convert the filtered voltage $V_{FT}$ to the control current $I_{CCO}$.

Figure 2:
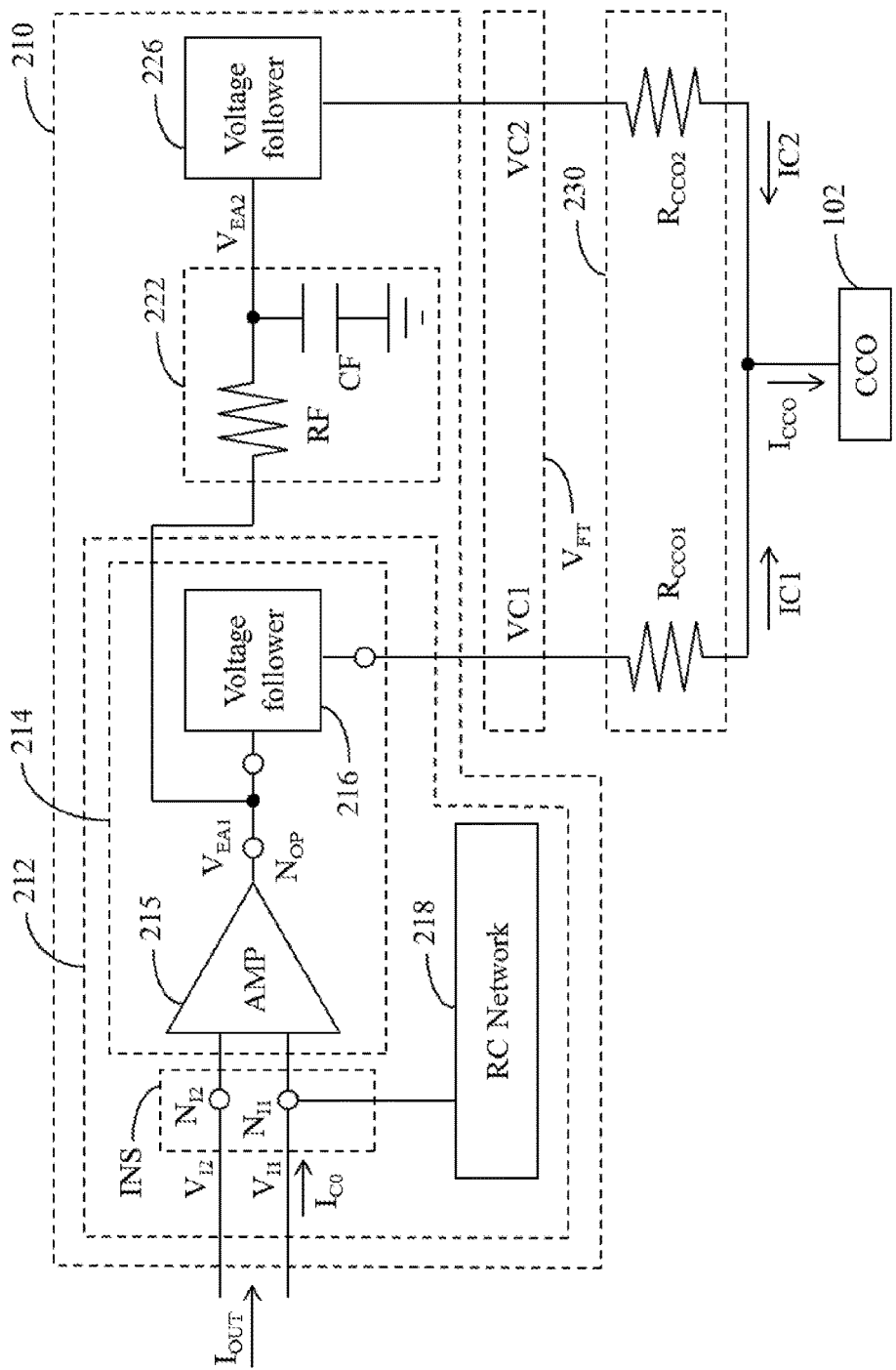
FIG. 2 is a block diagram illustrating an exemplary loop filter in accordance with some embodiments of the present disclosure.

It is worth noting that the loop filter 110 can employ a voltage regulator based filtering scheme to reduce noise or jitter produced by the PFD 106 and the charge pump circuit 108, while allowing the CCO 102 to maintain a wide tuning range. FIG. 2 is a block diagram illustrating an exemplary loop filter in accordance with some embodiments of the present disclosure. The loop filter 210, also referred to as a voltage regulator based loop filter, can represent an embodiment of the loop filter 110 shown in FIG. 1. As a result, the loop filter 210 can be configured to filter the current output $I_{OUT}$ shown in FIG. 1, and accordingly provide the filtered voltage $V_{FT}$ shown in FIG. 1 for a V2I converter 230, which can represent an embodiment of the V2I converter 130 shown in FIG. 1.

In the present embodiment, the loop filter 210 may include a voltage regulator based active filter 212, a low pass filter 222 and a voltage follower 226. The voltage regulator based active filter 212 is configured to filter the current output $I_{OUT}$ and produce a filtered signal, i.e. a control voltage VC1, serving as a portion of the filtered voltage $V_{FT}$. The voltage regulator based active filter 212 employs a voltage regulator based filtering scheme, which includes a voltage regulator 214 incorporated with an RC network 218.

The voltage regulator 214 may include an amplifier circuit (AMP) 215 and a voltage follower 216. The amplifier circuit 215, such as an error amplifier, has an input terminal $N_{I1}$, an input terminal $N_{I2}$ and an output terminal $N_{OP}$. The amplifier circuit 215 is configured to output an output signal $V_{EA1}$ from the output terminal $N_{OP}$ according to a voltage signal $V_{I1}$ at the input terminal $N_{I1}$ and a voltage signal $V_{I2}$ at the input terminal $N_{I2}$. The voltage follower 216, coupled to the output terminal $N_{OP}$, is configured to receive the output signal $V_{EA1}$ and generate the control voltage VC1 in response to the output signal $V_{EA1}$.

The RC network 218 is coupled to at least an input side INS of the voltage regulator 214 to produce at least one of the voltage signal $V_{I1}$ and the voltage signal $V_{I2}$. For example, in some cases, the RC network 218 is coupled to the input terminal $N_{I1}$, and configured to produce the voltage signal $V_{I1}$ in response to a current signal $I_{C0}$ applied to the input terminal $N_{I1}$. The current signal $I_{C0}$ may be, but is not limited to, a charge pump current signal and serve as at least a portion of the current output $I_{OUT}$. In some other cases, the RC network 218 is coupled to the input terminal $N_{I1}$ and also the voltage follower 216. As a result, the RC network 218 can be configured to produce the voltage signal $V_{I1}$ in response to the current signal $I_{C0}$ and an input/output of the voltage follower 216, e.g. the output signal $V_{EA1}$ or the control voltage VC1. In some other cases, the RC network 218 is coupled to the input terminal $N_{I1}$, the input terminal $N_{I2}$ and the voltage follower 216. In response to the current signal $I_{C0}$, another current signal applied to the input terminal $N_{I2}$ (not shown in FIG. 2), and the input/output of the voltage follower 216, the RC network 218 may produce the voltage signal $V_{I1}$ and also the voltage signal $V_{I2}$.

Please note that the RC network 218 can improve loop stability by creating, for example, at least one pole and at least one zero. As the voltage regulator 214 can provide a stable output substantially or almost independent of load current, temperature and supply voltage variations, the voltage regulator based active filter 212 integrating the voltage regulator 214 and the RC network 218 can not only enhance the PSRR but also maintain good loop stability.

The low pass filter 222 and the voltage follower 226 are used to provide another filtered signal for the V2I converter 230. The low pass filter 222, coupled to the output terminal $N_{OP}$ of the amplifier circuit 215, is configured to filter the output signal $V_{EA1}$ to generate an output signal $V_{EA2}$. In the present embodiment, the low pass filter 222 can utilize a resistor RF and a capacitor CF to perform low pass filtering. The voltage follower 226, coupled to the low pass filter 222, is configured to generate a filtered signal, i.e. a control voltage VC2, in response to the output signal $V_{EA2}$. The control voltage VC2 can serve as another portion of the filtered voltage $V_{FT}$.

In operation, the amplifier circuit 215 may compare the voltage signal $V_{I1}$ and the voltage signal $V_{I2}$ to generate the output signal $V_{EA1}$, wherein at least one of the voltage signal $V_{I1}$ and the voltage signal $V_{I2}$ is produced using the RC network 218. The voltage follower 216 can generate the control voltage VC1 according to the output signal $V_{EA1}$. Also, the voltage follower 226 can generate the control voltage VC2 according to a filtered version of the output signal $V_{EA1}$, i.e. the output signal $V_{EA2}$. The V2I converter 230 may utilize a resistor $R_{CCO1}$ to convert the control voltage VC1 to a portion of the control current $I_{CCO}$, i.e. a control current IC1, and utilize a resistor $R_{CCO2}$ to convert the control voltage VC2 to another portion of the control current $I_{CCO}$, i.e. a control current IC2.

In some embodiments, the voltage follower 226 can be a replica of the voltage follower 216. As a result, the control voltage VC2 can be a replica of the control voltage VC1. In some cases where the resistor $R_{CCO1}$ has a resistance which is K times a resistance of the resistor $R_{CCO2}$, the frequency response of the control current $I_{CCO}$ can be expressed by the following equation, where K is a positive number.

$$I_{CCO}(s)=VC1/R_{CCO1}+K\times VC2/R_{CCO1}\times(1/(1+s\times R_F\times C_F))$$

As can be seen from the equation, the magnitude of the control current $I_{CCO}$ is substantially equal to $VC1/R_{CCO1}$ under high frequency conditions where s is much greater than $1/R_F\times C_F$. This means that an oscillator gain under low frequency or direct-current (DC) conditions is substantially (1+K) times that under high frequency conditions. As a result, the CCO 102 can exhibit a wide tuning range and good phase noise performance.

Please note that circuit topology and operations described above are for illustrative purposes only, and are not intended to limit the scope of the present disclosure. In some embodiments, at least one of the low pass filter 222 and the V2I converter 230 can utilize other circuit structures to perform associated operations. In some embodiments, the CCO 102 may receive the control currents IC1 and IC2 through different input terminals. In some embodiments, the loop filter 210 can provide a single control voltage or more than two control voltages to the V2I converter 230. For example, the loop filter 210 can further include one or more voltage followers to produce corresponding control voltage(s). The V2I converter 230 may further include corresponding resistor path(s) to convert the corresponding control voltage(s). Other filter circuits, each utilizing a voltage regulator integrated/incorporated with an RC network to realize a voltage regulator based active filter, are also within the contemplated scope of the present disclosure.

Additionally, although described with the reference to a PLL system, the loop filter 210 may serve as a filter circuit employed in other types of loop circuits or other circuit applications to improve noise reduction.

To facilitate understanding of the present disclosure, some embodiments are given in the following for further description of the voltage regulator based filtering scheme. Those skilled in the art should appreciate that other embodiments employing the voltage regulator based active filter 212 shown in FIG. 2 are also within the contemplated scope of the present disclosure.

Figure 3:
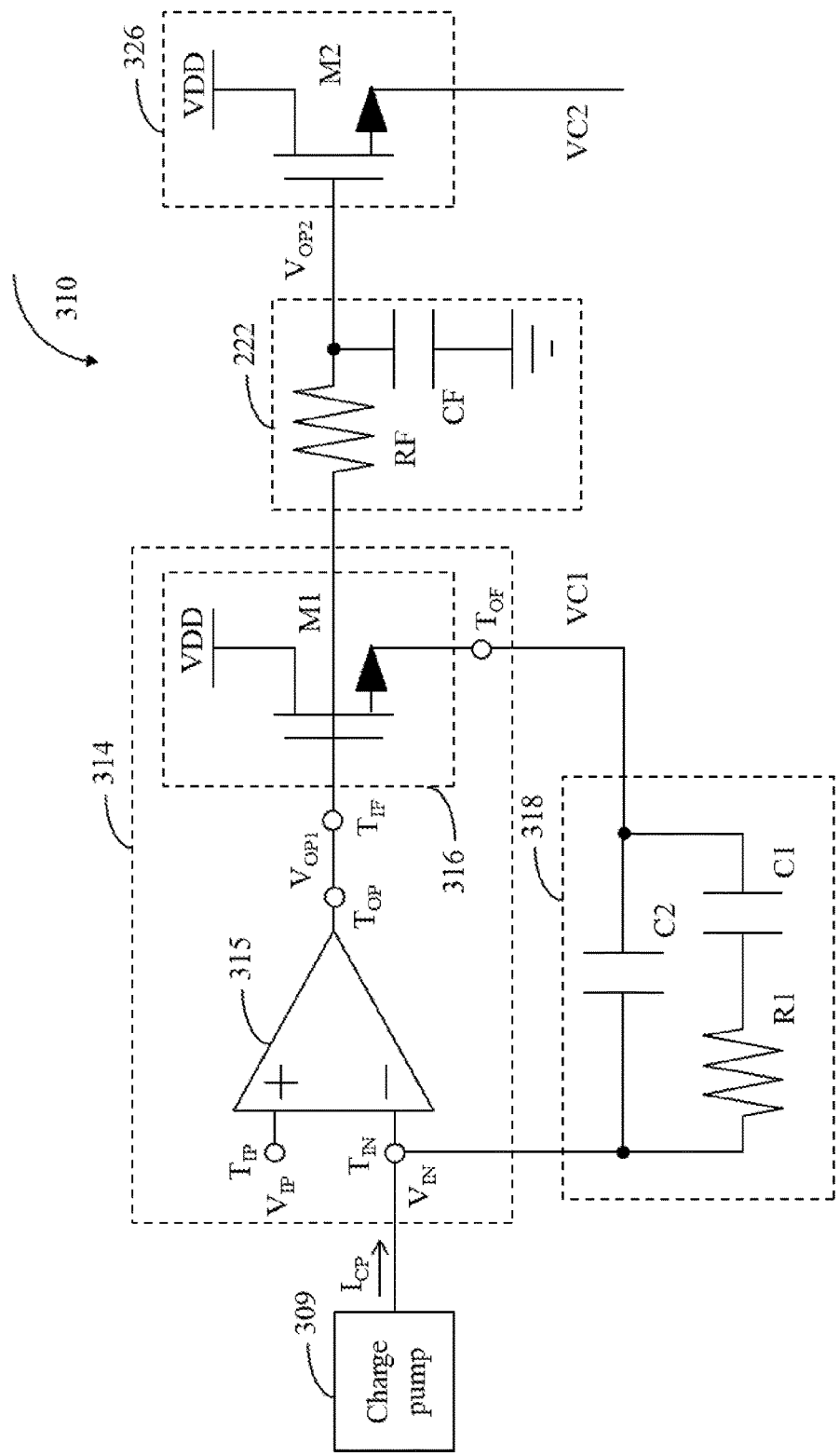
FIG. 3 illustrates an exemplary loop filter in accordance with some embodiments of the present disclosure.

FIG. 3 illustrates an exemplary loop filter in accordance with some embodiments of the present disclosure. The loop filter 310 can represent an embodiment of the loop filter 210 shown in FIG. 2. In the present embodiment, the loop filter 310 can be configured to filter a current signal, i.e. a charge pump current signal $I_{CP}$, to produce the control voltages VC1 and VC2. The charge pump current signal $I_{CP}$ is outputted from a charge pump 309, which can represent an embodiment of at least a portion of the charge pump circuit 108 shown in FIG. 1. However, those skilled in the art will recognize that the current signal filtered by the loop filter 310 may be provided by other types of current sources/sinks without departing from the scope of the present disclosure.

In addition, the loop filter 310 may include the low pass filter 222 shown in FIG. 2, a voltage regulator 314, an RC network 318 and a voltage follower 326. The voltage regulator 314, the RC network 318 and the voltage follower 326 can represent embodiments of the voltage regulator 214, the RC network 218 and the voltage follower 226 shown in FIG. 2, respectively.

The voltage regulator 314 may include an amplifier circuit 315 and a voltage follower 316. The amplifier circuit 315 has an input terminal $T_{IN}$, an input terminal $T_{IP}$ and an output terminal $T_{OP}$, wherein the input terminal $T_{IN}$ is coupled to the charge pump 309 to receive the charge pump current signal $I_{CP}$. The amplifier circuit 315 is configured to output an output signal $V_{OP1}$ from the output terminal $T_{OP}$ according to a voltage signal $V_{IN}$ at the input terminal $T_{IN}$ and a voltage signal $V_{IP}$ at the input terminal $T_{IP}$.

The voltage follower 316 has an input terminal $T_{IF}$ and an output terminal $T_{OF}$, wherein the input terminal $T_{IF}$ is coupled to the output terminal $T_{OP}$ to receive the output signal $V_{OP1}$. The voltage follower 316 is configured to generate a filtered signal, i.e. the control voltage VC1, in response to the output signal $V_{OP1}$. In the present embodiment, the voltage follower 316 may be implemented by a transistor M1. A control terminal of the transistor M1 is coupled to the input terminal $T_{IF}$. One connection terminal of the transistor M1 is coupled to a supply voltage VDD, and the other connection terminal of the transistor M1 is coupled to the output terminal $T_{OF}$. Those skilled in the art should appreciate that the voltage follower 316 can be implemented by other circuit structures without departing from the scope of the present disclosure.

The RC network 318, coupled to the input terminal $T_{IN}$ and the voltage follower 316, is configured to produce the voltage signal $V_{IN}$ in response to the charge pump current signal $I_{CP}$ and the output signal $V_{OP1}$ received by the voltage follower 316. In the present embodiment, the RC network 318 is coupled to the output terminal $T_{OF}$ of the voltage follower 316 to receive a buffered version of the output signal $V_{OP1}$, i.e. the control voltage VC1. As a result, the RC network 318 may produce the voltage signal $V_{IN}$ according to the charge pump current signal $I_{CP}$ and the control voltage VC1.

The RC network 318 may include, but is not limited to, a resistor R1 and a plurality of capacitors C1 and C2. The resistor R1 and the capacitor C1 are connected in series between the input terminal $T_{IN}$ and the output terminal $T_{OF}$. The capacitor C2 is coupled between the input terminal $T_{IN}$ and the output terminal $T_{OF}$. Those skilled in the art should appreciate that the RC network 318 can be implemented by other circuit structures, each being coupled between the input terminal $T_{IN}$ and the output terminal $T_{OF}$, without departing from the scope of the present disclosure.

The low pass filter 222, coupled to the input terminal $T_{IF}$ of the voltage follower 316, is configured to filter the output signal $V_{OP1}$ to generate an output signal $V_{OP2}$, i.e. a filtered version of the output signal $V_{OP1}$. The voltage follower 326, coupled to the low pass filter 222, is configured to generate the control voltage VC2, in response to the output signal $V_{OP2}$. In the present embodiment, the voltage follower 316 may be implemented by a transistor M2. A control terminal of the transistor M2 is configured to receive the output signal $V_{OP2}$. One connection terminal of the transistor M2 is coupled to the supply voltage VDD, and the other connection terminal of the transistor M2 is configured to output the control voltage VC2. Those skilled in the art should appreciate that the voltage follower 326 can be implemented by other circuit structures without departing from the scope of the present disclosure.

In operation, the amplifier 315 may compare the voltage signal $V_{IN}$ and the voltage signal $V_{IP}$ to generate the output signal $V_{OP1}$, wherein the voltage signal $V_{IN}$ is produced using the RC network 318, and the voltage signal $V_{IP}$ may be a reference voltage signal coupled to the input terminal $T_{IP}$. The voltage follower 316 can receive the output signal $V_{OP1}$ and accordingly generate the control voltage VC1, which can be fed into the RC network 318 as well as a V2I converter (not shown in FIG. 3). Also, the voltage follower 326 can receive the output signal $V_{OP2}$ and provide the control voltage VC2 for the V2I converter.

Figure 4:
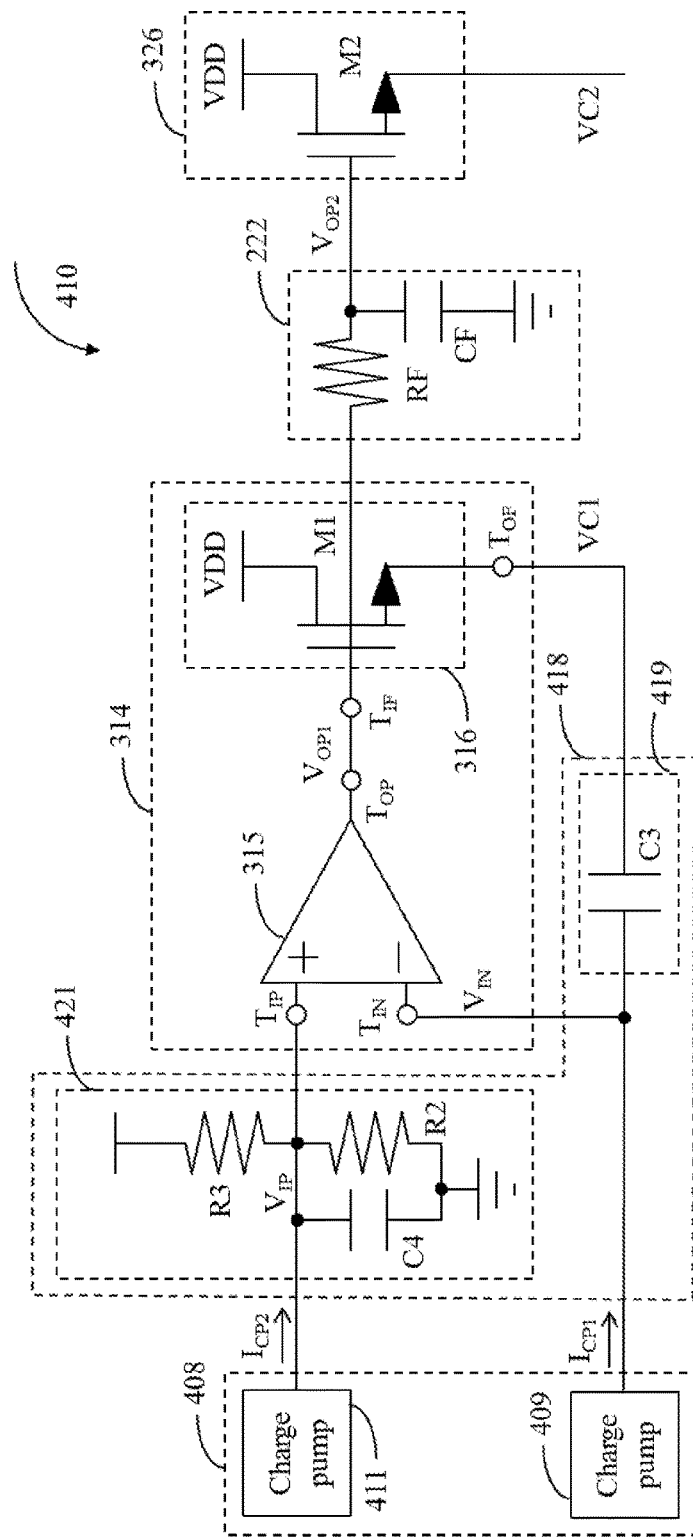
FIG. 4 illustrates an exemplary loop filter in accordance with some embodiments of the present disclosure.

FIG. 4 illustrates an exemplary loop filter in accordance with some embodiments of the present disclosure. The loop filter 410 can represent another embodiment of the loop filter 210 shown in FIG. 2. The difference between the loop filter 410 and the loop filter 310 shown in FIG. 3 is that the loop filter 410 utilizes an RC network 418 to produce both the voltage signals $V_{IN}$ and $V_{IP}$. In the present embodiment, the loop filter 410 is configured to receive charge pump current signals $I_{CP1}$ and $I_{CP2}$ provided by a charge pump circuit 408, which can represent an embodiment of the charge pump circuit 108 shown in FIG. 1. Also, the loop filter 410 is configured to filter the charge pump current signals $I_{CP1}$ and $I_{CP2}$ to produce the control voltages VC1 and VC2. The charge pump current signals $I_{CP1}$ and $I_{CP2}$ are respectively outputted from charge pumps 409 and 411 included in the charge pump circuit 408. Please note that at least one of current signals filtered by the loop filter 410 may be provided by other types of current sources/sinks without departing from the scope of the present disclosure.

The RC network 418 can represent an embodiment of the RC network 218 shown in FIG. 2. In addition to the input terminal $T_{IN}$ and the output terminal $T_{OF}$, the RC network 418 is coupled to the input terminal $T_{1P}$. As a result, the RC network 418 can be configured to produce the voltage signals $V_{IN}$ and $V_{IP}$ according to the charge pump current signal $I_{CP1}$ applied to the input terminal $T_{IN}$, the charge pump current signal $I_{CP2}$ applied to the input terminal $T_{Ip}$, and the control voltage VC1 outputted from the output terminal $T_{OF}$.

In the present embodiment, the RC network 418 may include a frequency responsive circuit 419 and a frequency responsive circuit 421. The frequency responsive circuit 419, coupled between the input terminal $T_{IN}$ of the amplifier circuit 315 and the output terminal $T_{OF}$ of the voltage follower 316, is configured to produce the voltage signal $V_{IN}$ according to the charge pump current signal $I_{CP1}$ and the control voltage VC1. The frequency responsive circuit 421, coupled to the input terminal $T_{IP}$ of the amplifier circuit 315, is configured to produce the voltage signal $V_{IP}$ in response to the charge pump current signal $I_{CP2}$ applied to the input terminal $T_{IP}$.

By way of example but not limitation, the frequency responsive circuit 419 may include a capacitor C3, which is coupled between the input terminal $T_{IN}$ and the output terminal $T_{OF}$. Those skilled in the art should appreciate that the frequency responsive circuit 419 can be implemented by other circuit structures, each being coupled between the input terminal $T_{IN}$ and the output terminal $T_{OF}$, without departing from the scope of the present disclosure. In addition, the frequency responsive circuit 421 may include, but is not limited to, a capacitor C4 and a plurality of resistors R2 and R3. The capacitor C4 and resistor R2 are connected in parallel between the input terminal $T_{IP}$ and ground. The resistor R3 is coupled between the supply voltage VDD and the input terminal $T_{IP}$. Those skilled in the art should appreciate that the frequency responsive circuit 421 can be implemented by other circuit structures, each being coupled to the input terminal $T_{IP}$, without departing from the scope of the present disclosure.

Figure 5:
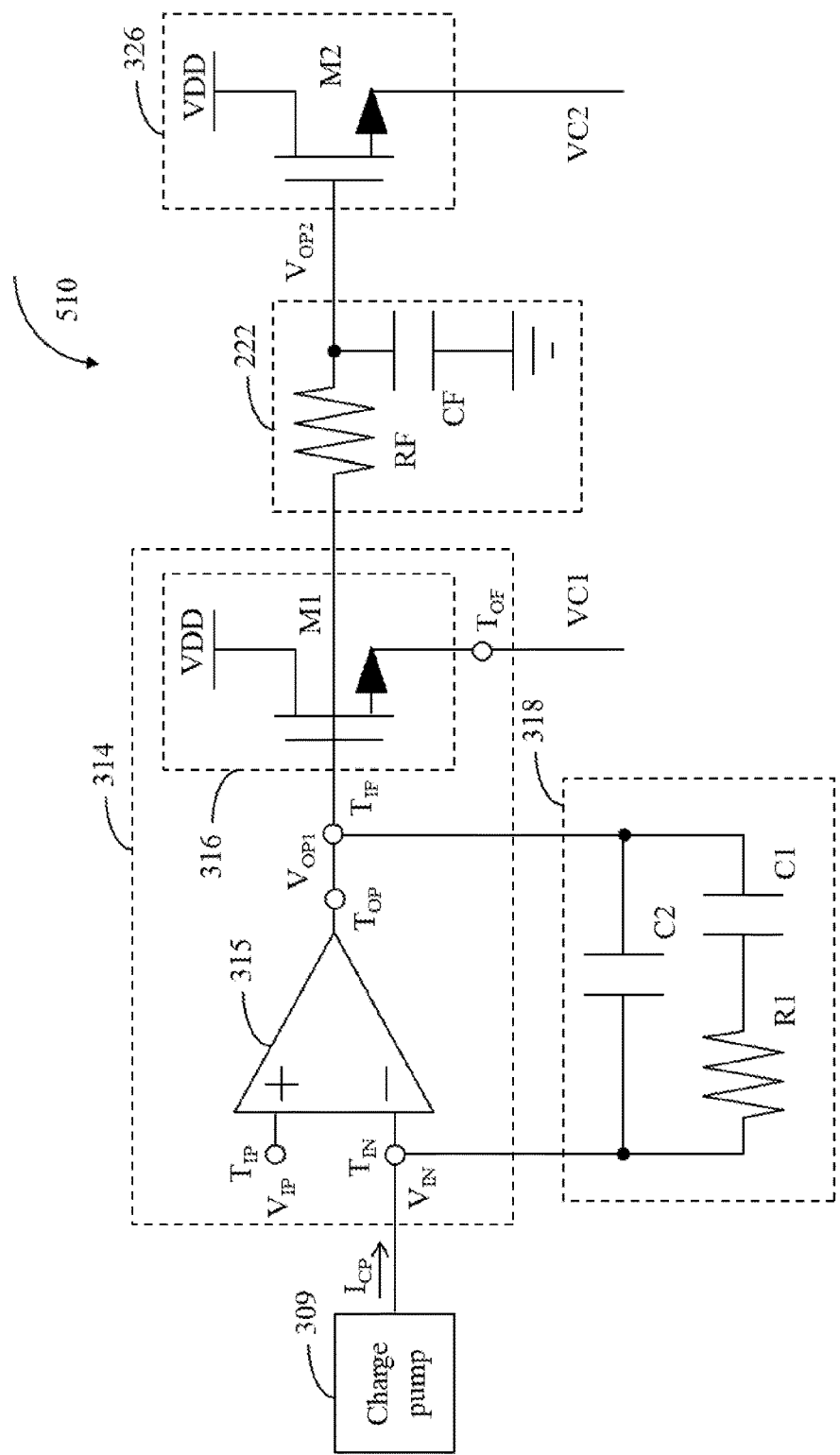
FIG. 5 illustrates an exemplary loop filter in accordance with some embodiments of the present disclosure.

FIG. 5 illustrates an exemplary loop filter in accordance with some embodiments of the present disclosure. The loop filter 510 can represent another embodiment of the loop filter 210 shown in FIG. 2. The loop filter 510 is similar to the loop filter 310 described and illustrated with reference to FIG. 3 except that, for example, the RC network 318 is coupled to the voltage follower 316 through the input terminal $T_{IF}$. As a result, the RC network 318 is configured to produce the voltage signal $V_{IN}$ according to the charge pump current signal $I_{CP}$ and the output signal $V_{OP1}$. Since the loop filter 510 is similar to the loop filter 310 described and illustrated with reference to FIG. 3, the associated descriptions are not repeated here for the sake of brevity.

Figure 6:
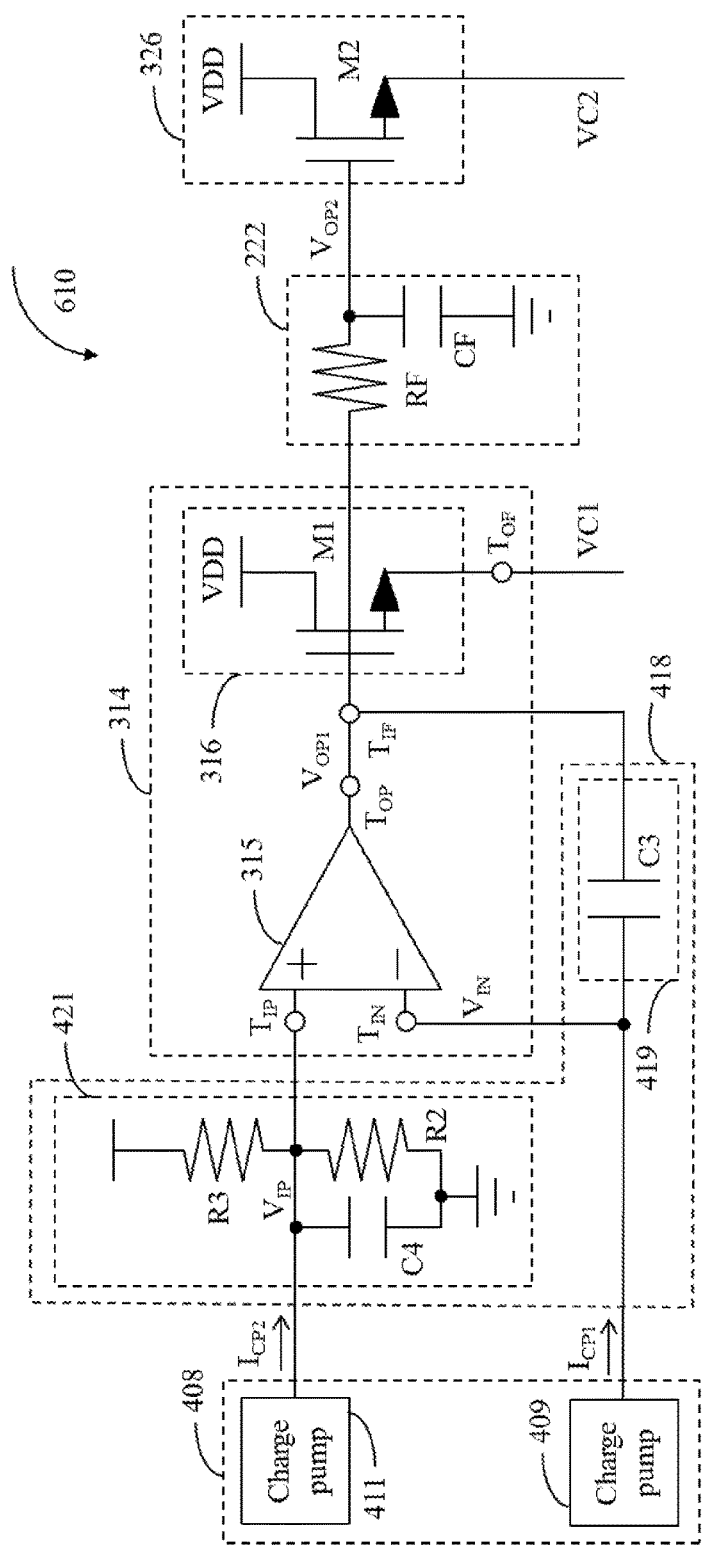
FIG. 6 illustrates an exemplary loop filter in accordance with some embodiments of the present disclosure.

FIG. 6 illustrates an exemplary loop filter in accordance with some embodiments of the present disclosure. The loop filter 610 can represent another embodiment of the loop filter 210 shown in FIG. 2. The loop filter 610 is similar to the loop filter 410 described and illustrated with reference to FIG. 4 except that, for example, the RC network 418 is coupled to the voltage follower 316 through the input terminal $T_{IF}$. As a result, the RC network 418 is configured to produce the voltage signal $V_{IN}$ according to the charge pump current signal $I_{CP1}$ and the output signal $V_{OP1}$. For example, the frequency responsive circuit 419 is coupled between the input terminal $T_{IN}$ of the amplifier circuit 315 and the input terminal $T_{IF}$ of the voltage follower 316, and configured to produce the voltage signal $V_{IN}$ according to the charge pump current signal $I_{CP1}$ and the output signal $V_{OP1}$. The frequency responsive circuit 421, coupled to the input terminal $T_{IP}$ of the amplifier circuit 315, is configured to produce the voltage signal $V_{IP}$ in response to the charge pump current signal $I_{CP2}$ applied to the input terminal $T_{IP}$. As the loop filter 610 is similar to the loop filter 410 described and illustrated with reference to FIG. 4, the associated descriptions are not repeated here for the sake of brevity.

Figure 7:
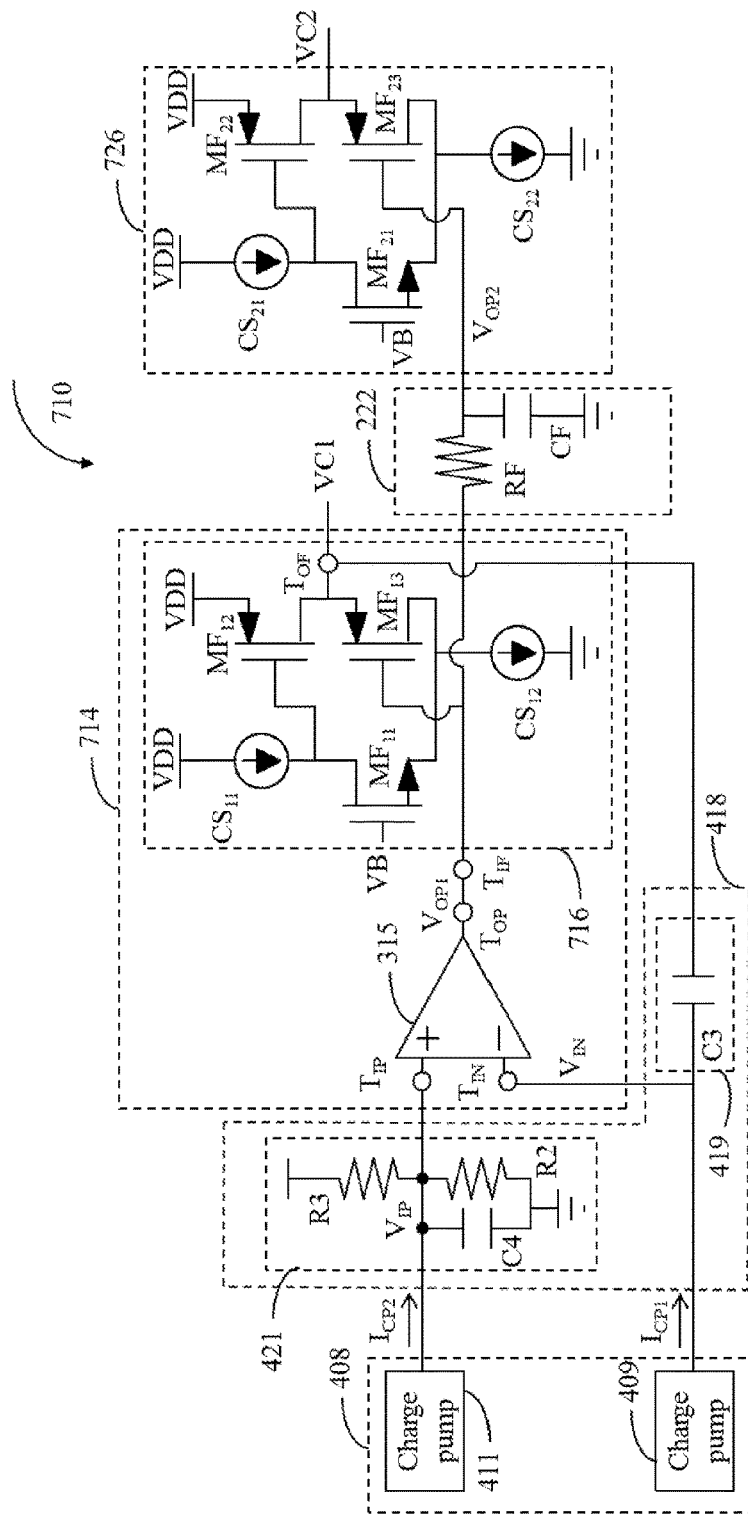
FIG. 7 illustrates an exemplary loop filter in accordance with some embodiments of the present disclosure.

FIG. 7 illustrates an exemplary loop filter in accordance with some embodiments of the present disclosure. The loop filter 710 can represent another embodiment of the loop filter 210 shown in FIG. 2. The loop filter 710 is similar to the loop filter 310 described and illustrated with reference to FIG. 3 except that, for example, respective circuit structures of the voltage followers 716 and 726 are different from those of the voltage followers 316 and 326 shown in FIG. 3. In the present embodiment, the voltage follower 716 of the voltage regulator 726 can be implemented as a flipped voltage follower, which may include a current source $CS_{11}$, a current sink $CS_{12}$ and a plurality of transistors $MF_{11}$-$MF_{13}$. The current source $CS_{11}$ is coupled between the supply voltage VDD and a drain of the transistor $MF_{11}$, and the current sink $CS_{12}$ is coupled between a source of the transistor $MF_{11}$ and ground. The transistor $MF_{11}$ is controlled by a bias voltage VB supplied to a gate thereof. A source of the transistor $MF_{12}$ is coupled to the supply voltage VDD, a gate of the transistor $MF_{12}$ is coupled to the drain of the transistor $MF_{11}$, and a drain of the transistor $MF_{12}$ is coupled to the output terminal $T_{OF}$. A source of the transistor $MF_{13}$ is coupled to the output terminal $T_{OF}$, a gate of the transistor $MF_{13}$ is coupled to the input terminal $T_{IF}$, and a drain of the transistor $MF_{13}$ is coupled to the source of the transistor $MF_{11}$.

Similarly, voltage regulator 726 may include a current source $CS_{21}$, a current sink $CS_{22}$ and a plurality of transistors $MF_{21}$-$MF_{23}$. The current source $CS_{21}$ is coupled between the supply voltage VDD and a drain of the transistor $MF_{21}$, and the current sink $CS_{22}$ is coupled between a source of the transistor $MF_{21}$ and ground. The transistor $MF_{21}$ is controlled by the bias voltage VB supplied to a gate thereof. A source of the transistor $MF_{22}$ is coupled to the supply voltage VDD, and a gate of the transistor $MF_{22}$ is coupled to the drain of the transistor $MF_{21}$. A source of the transistor $MF_{23}$ is coupled to a drain of the transistor $MF_{22}$, a gate of the transistor $MF_{23}$ is coupled to the low pass filter 222 to receive the output signal $V_{OP2}$, and a drain of the transistor $MF_{23}$ is coupled to the source of the transistor $MF_{21}$. As the loop filter 710 is similar to the loop filter 310 described and illustrated with reference to FIG. 3, the associated descriptions are not repeated here for the sake of brevity.

Figure 8:
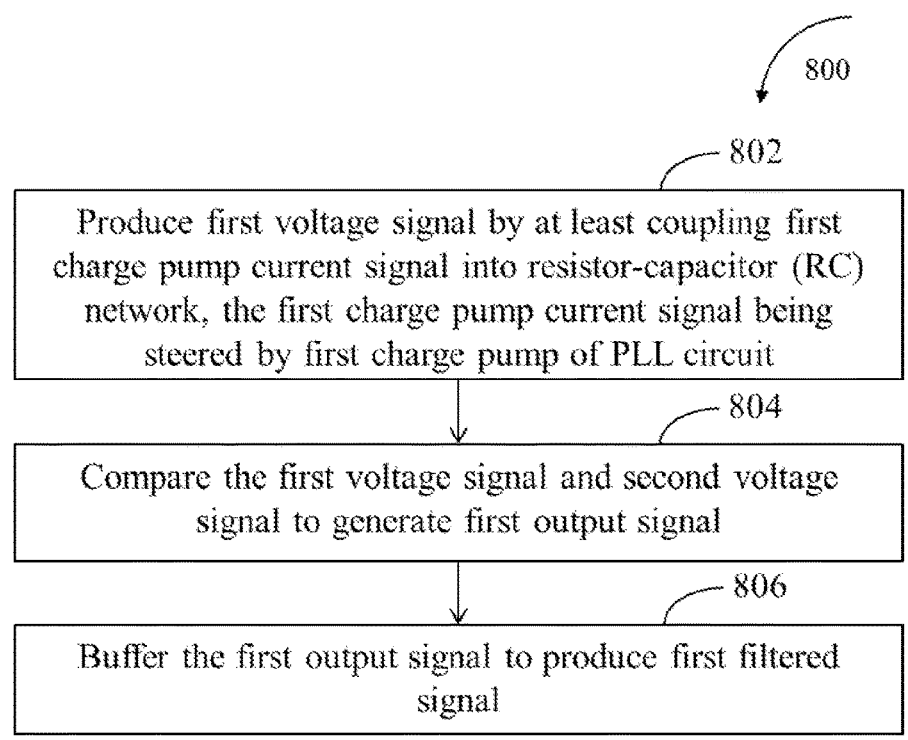
FIG. 8 illustrates a flow chart of an exemplary loop filtering method for a PLL circuit in accordance with some embodiments of the present disclosure.

FIG. 8 illustrates a flow chart of an exemplary loop filtering method for a phase-locked loop (PLL) circuit in accordance with some embodiments of the present disclosure. The method 800 may be employed in at least one of the loop filters illustrated and described with reference to FIG. 1 through FIG. 7. In some embodiments, other operations in the method 800 can be performed. In some embodiments, operations of the method 800 can be performed in a different order and/or vary.

At operation 802, a first voltage signal is produced by at least coupling a first charge pump current signal into a resistor-capacitor (RC) network. The first charge pump current signal is steered by a first charge pump of the PLL circuit. For example, in the embodiment shown in FIG. 4, the voltage signal $V_{IN}$ is produced by at least coupling the charge pump current signal $IC_{P1}$ into the RC network 418. The charge pump 409 is utilized to steer the charge pump current signal $I_{CP1}$.

At operation 804, the first voltage signal is compared with a second voltage signal to generate a first output signal. For example, in the embodiment shown in FIG. 4, the voltage signal $V_{IN}$ is compared with the voltage signal $V_{IP}$ to generate the output signal $V_{OP1}$.

At operation 806, the first output signal is buffered to produce a first filtered signal. For example, in the embodiment shown in FIG. 4, the output signal $V_{OP1}$ is buffered to produce a filtered signal, i.e. the control voltage VC1.

In some embodiments, the first filtered signal may also be coupled into the RC network to produce the first voltage signal. For example, in the embodiment shown in FIG. 4, the charge pump current signal $I_{CP1}$ and the control voltage VC1 are coupled into the RC network 418 to produce the voltage signal $V_{IN}$.

In some embodiments, the first voltage signal is produced by coupling the first charge pump current signal and the first filtered signal is coupled into a first frequency responsive circuit of the RC network, while the second voltage signal is produced by coupling a second charge pump current signal into a second frequency responsive circuit of the RC network. For example, in the embodiment shown in FIG. 4, the charge pump current signal $I_{CP1}$ and the control voltage VC1 are coupled into the frequency responsive circuit 419 to produce the voltage signal $V_{IN}$, while the charge pump current signal $I_{CP2}$ is coupled into the frequency responsive circuit 421 to produce the voltage signal $V_{IP}$.

With the use of a voltage regulator based filtering scheme which integrates a voltage regulator and an RC network, a loop circuit using the voltage regulator based filtering scheme can not only enhance the PSRR but also maintain good loop stability. Also, the voltage regulator based filtering scheme may produce multiple control signals for an oscillator, thus enhancing a tuning range and phase noise performance of the oscillator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A filter circuit, comprising:
    an amplifier circuit, having a first input terminal, a second input terminal and an output terminal, the amplifier circuit configured to output a first output signal from the output terminal according to a first voltage signal at the first input terminal and a second voltage signal at the second input terminal;
    a resistor-capacitor (RC) network, coupled to the first input terminal, the RC network configured to produce the first voltage signal at least in response to a first current signal applied to the first input terminal; and
    a first voltage follower, coupled to the output terminal, the first voltage follower configured to receive the first output signal, and generate a first filtered signal in response to the first output signal;
    wherein the RC network is further coupled to the first voltage follower, and is configured to produce the first voltage signal in response to the first current signal and the first output signal.

2. The filter circuit of claim 1, wherein the first input terminal is configured to receive a charge pump current signal as the first current signal applied to the first input terminal, and the second input terminal is configured to receive a reference voltage signal as the second voltage signal.

3. The filter circuit of claim 1, wherein the RC network is coupled to an output terminal of the first voltage follower to receive the first filtered signal, and configured to produce the first voltage signal according to the first current signal and the first filtered signal.

4. The filter circuit of claim 3, wherein the RC network comprises a first frequency responsive circuit and a second frequency responsive circuit; the first frequency responsive circuit is coupled between the first input terminal of the amplifier circuit and the output terminal of the first voltage follower, and configured to produce the first voltage signal according to the first current signal and the first filtered signal; the second frequency responsive circuit is coupled to the second input terminal of the amplifier circuit, and configured to produce the second voltage signal in response to a second current signal applied to the second input terminal.

5. The filter circuit of claim 4, wherein the first input terminal of the amplifier circuit is configured to receive a first charge pump current signal as the first current signal applied to the first input terminal, and the second input terminal of the amplifier circuit is configured to receive a second charge pump signal as the second current signal applied to the second input terminal.

6. The filter circuit of claim 1, wherein the RC network is coupled to an input terminal of the first voltage follower to receive the first output signal, and configured to produce the first voltage signal according to the first current signal and the first output signal.

7. The filter circuit of claim 6, wherein the RC network comprises a first frequency responsive circuit and a second frequency responsive circuit; the first frequency responsive circuit is coupled between the first input terminal of the amplifier circuit and the input terminal of the first voltage follower, and configured to produce the first voltage signal according to the first current signal and the first output signal; the second frequency responsive circuit is coupled to the second input terminal of the amplifier circuit, and configured to produce the second voltage signal according to a second current signal applied to the second input terminal of the amplifier circuit.

8. The filter circuit of claim 7, wherein the first input terminal of the amplifier circuit is configured to receive a first charge pump current signal as the first current signal applied to the first input terminal of the amplifier circuit, and the second input terminal of the amplifier circuit is configured to receive a second charge pump signal as the second current signal applied to the second input terminal of the amplifier circuit.

9. The filter circuit of claim 1, further comprising:
a low pass filter, coupled to the output terminal of the amplifier circuit, the low pass filter configured to filter the first output signal to generate a second output signal; and
a second voltage follower, coupled to the low pass filter, the second voltage follower configured to generate a second filtered signal in response to the second output signal.

10. The filter circuit of claim 9, wherein the second voltage follower is a replica of the first voltage follower.

11. A phase-locked loop (PLL) circuit, comprising:
a loop filter, configured to generate a first control voltage, the loop filter comprises:
an amplifier circuit, having a first input terminal, a second input terminal and an output terminal, the amplifier circuit configured to output a first output signal from the output terminal according to a first voltage signal at the first input terminal and a second voltage signal at the second input terminal;
a resistor-capacitor (RC) network, coupled to the first input terminal, the RC network configured to produce the first voltage signal at least in response to a first current signal applied to the first input terminal; and
a first voltage follower, coupled to the output terminal, the first voltage follower configured to receive the first output signal, and generate the first control voltage in response to the first output signal;
a voltage-to-current converter, coupled to the first voltage follower, the voltage-to-current converter configured to convert the first control voltage to a first control current; and
a current-controlled oscillator, coupled to the voltage-to-current converter, the current-controlled oscillator configured to generate an oscillator signal at least according to the first control current;
wherein the RC network is further coupled to the first voltage follower, and is configured to produce the first voltage signal in response to the first current signal and the first output signal.

12. The PLL circuit of claim 11, wherein the loop filter further comprises:
a low pass filter, coupled to the output terminal of the amplifier circuit, the low pass filter configured to filter the first output signal to generate a second output signal; and
a second voltage follower, coupled to the low pass filter, the second voltage follower configured to generate a second control voltage in response to the second output signal;
wherein the voltage-to-current converter is configured to convert the second control voltage to a second control current, and the current-controlled oscillator is configured to generate the oscillator signal according to the first control current and the second control current.

13. The PLL circuit of claim 12, wherein the second voltage follower is a replica of the first voltage follower.

14. The PLL circuit of claim 11, further comprising:
a first charge pump, coupled to the first input terminal of the amplifier circuit, the first charge pump configured to provide the first current signal to the first input terminal.

15. The PLL circuit of claim 14, further comprising:
a second charge pump, coupled to the second input terminal of the amplifier circuit, the second charge pump configured to provide a second current signal to the second input terminal;
wherein the RC network is further coupled to the second input terminal, and configured to produce the second voltage signal in response to the second current signal applied to the second input terminal.

16. The PLL circuit of claim 15, wherein the RC network comprises:
a first frequency responsive circuit, coupled between the first input terminal and the first voltage follower, the first frequency responsive circuit configured to produce the first voltage signal in response to the first current signal and the first output signal; and
a second frequency responsive circuit, coupled to the second input terminal, the second frequency responsive circuit configured to produce the second voltage signal in response to the second current signal.

17. A loop filtering method for a phase-locked loop (PLL) circuit, the loop filtering method comprising:
producing a first voltage signal by at least coupling a first charge pump current signal into a resistor-capacitor (RC) network, the first charge pump current signal being steered by a first charge pump of the PLL circuit;
comparing the first voltage signal and a second voltage signal to generate a first output signal; and
buffering, by a voltage follower coupled to the RC network, the first output signal to produce a first filtered signal;

wherein the step of producing the first voltage signal by at least coupling the first charge pump current signal into the RC network comprises:
producing the first voltage signal in response to the first charge pump signal and the first output signal buffered by the voltage follower.

18. The loop filtering method of claim 17, wherein the step of producing the first voltage signal in response to the first charge pump current signal and the first output signal comprises:
coupling the first filtered signal into the RC network, wherein the first voltage signal is produced according to the first charge pump current signal and the first filtered signal.

19. The loop filtering method of claim 17, wherein the first charge pump current signal and the first filtered signal is coupled into a first frequency responsive circuit of the RC network to produce the first voltage signal; the loop filtering method further comprises:
producing the second voltage signal by coupling a second charge pump current signal into a second frequency responsive circuit of the RC network, the second charge pump current signal being steered by a second charge pump of the PLL circuit.

\* \* \* \* \*